United States Patent [19]

Shirai et al.

[11] Patent Number: 5,075,754
[45] Date of Patent: Dec. 24, 1991

[54] SEMICONDUCTOR DEVICE HAVING IMPROVED WITHSTANDING VOLTAGE CHARACTERISTICS

[75] Inventors: Koji Shirai, Kawasaki; Ken Kawamura, Yokohama, both of Japan

[73] Assignee: Kabushiki Kaisha Toshiba, Kawasaki, Japan

[21] Appl. No.: 622,146

[22] Filed: Dec. 4, 1990

Related U.S. Application Data

[63] Continuation of Ser. No. 209,965, Jun. 21, 1988, abandoned.

[51] Int. Cl.$^5$ ............................................. H01L 29/40
[52] U.S. Cl. .................................... 357/53; 357/52; 357/68; 357/65
[58] Field of Search ................... 357/53, 52, 54, 68, 357/65

[56] References Cited

U.S. PATENT DOCUMENTS 4,567,502  1/1986  Nakagawa .......................... 357/53
4,649,414  3/1987  Ueda et al. ............................ 357/53

FOREIGN PATENT DOCUMENTS 0061551  10/1982  European Pat. Off. .
58-17676   2/1983  Japan .
58-46678   3/1983  Japan .

OTHER PUBLICATIONS

Ghandi, "VLSI Fabrication Principles", pp. 28, 435–437.

*Primary Examiner*—Andrew J. James
*Assistant Examiner*—Courtney A. Bowers
*Attorney, Agent, or Firm*—Finnegan, Henderson Farabow, Garrett, and Dunner

[57] ABSTRACT

A semiconductor device comprises a substrate including a p-type first semiconductor region, an n-type second semiconductor region formed in the first semiconductor region, a first insulating layer formed on surfaces of the first semiconductor region and the second semiconductor region, a first conductive layer formed, via the first insulating layer, over the surface of the second semiconductor region, and set at substantially the same potential as that of the second semiconductor region, an n-type third semiconductor region formed to be spaced apart from the second semiconductor region and formed in the first semiconductor region so that a part of the third semiconductor region overlaps a part of the first conductive layer, via the first insulating layer, a second conductive layer connected to the third semiconductor region through an opening formed in the first insulating layer, and a wiring layer formed on a second insulating layer provided on surfaces of the first and second conductive layers.

14 Claims, 3 Drawing Sheets

SEMICONDUCTOR DEVICE HAVING IMPROVED WITHSTANDING VOLTAGE CHARACTERISTICS

This is a continuation of application Ser. No. 07/209,965 filed June 21, 1988 now abandoned.

BACKGROUND OF THE INVENTION

1. Field of the Invention

The present invention relates to a semiconductor device having improved withstanding voltage characteristics.

2. Description of the Related Art

In a conventional semiconductor device such as a semiconductor integrated circuit (IC), a conductive layer called a field plate is frequently formed so as to improve the withstanding voltage characteristics between a substrate and a diffusion region formed therein.

FIG. 4 is a sectional view of a semiconductor device having the field plate described above. N-type diffusion region 31 is formed in p-type silicon semiconductor substrate 30. Field plate 33 consisting of polysilicon or the like is formed through insulating layer 32 on a substrate surface near the end of diffusion region 31. The potential of field plate 33 is set at the same value as that of diffusion region 31. When field plate 33 is formed, depletion layer 34 extending from diffusion region 31 in the substrate is spread near the end of field plate 33, thereby improving the withstanding voltage characteristics between substrate 30 and diffusion region 31.

In a conventional IC, however, another wiring layer 36 is often formed through insulating layer 35 on field plate 33, as shown in FIG. 4. In this case, an electric field is concentrated near the end of field plate 33 by the influence of a difference between the potentials of wiring layer 36 and field plate 33. Therefore, the withstanding voltage between substrate 30 and diffusion region 31 is considerably decreased as compared with a case wherein wiring layer 36 is not arranged.

The thicknesses of insulating layers 32 and 35 may be increased as a countermeasure against the above problem. However, the process and pattern are limited in this method. For example, a wiring step coverage tends to be poor at corners having a thin insulating film. In addition, variations in thickness undesirably cause large variations in withstanding voltage characteristics.

When the thickness of the insulating layer is increased, cracks occur in the insulating layer and hence wiring layer 36 formed thereon. Therefore, this method has a disadvantage in reliability.

As has been described above, in a semiconductor device having a field plate, variations in withstanding voltage characteristics occur, thereby degrading reliability of the device.

SUMMARY OF THE INVENTION

The present invention has been made in consideration of the above situation, and has as its object to provide a semiconductor device which can increase a withstanding voltage without variations in withstanding voltage characteristics and degradation of reliability.

A semiconductor device according to the present invention comprises: e.g., p-type first semiconductor region 10; n-type second semiconductor region 11 formed in first semiconductor region 10; first insulating layer 13 formed on a surface of first semiconductor region 10, including a surface of second semiconductor region 11; first conductive layer 14 formed, via first insulating layer 13, over the surface of second semiconductor region 11, and set at substantially the same potential as that of second semiconductor region 11; n-type third semiconductor region 12 formed to be spaced apart from second semiconductor region 11 and formed in first semiconductor region 10 so that a part of third semiconductor region 12 overlaps a part of first conductive layer 14, via first insulating layer 13; second conductive layer 15 connected to third semiconductor region 12 through opening 16 formed in first insulating layer 13; and third conductive layer 18 formed on second insulating layer 17 provided on surfaces of first and second conductive layers 14 and 15.

According to the semiconductor device of the present invention, third semiconductor region 12 is formed, such that it partially overlaps, via first insulating layer 13, first conductive layer 14 serving as a field plate. Therefore, the potential of third semiconductor region 12 is lower than that of first conductive layer 14 by a value corresponding to the thickness of first insulating layer 13. In addition, second conductive layer 15 serving as a field is formed through first insulating layer 13 on a surface of third semiconductor region 12. Therefore, an electric field between third and first semiconductor regions 12 and 10 is reduced.

BRIEF DESCRIPTION OF THE DRAWINGS

FIGS. 1A and 1B show an arrangement according to a first embodiment of the present invention, in which FIG. 1A is a sectional view of the arrangement, and FIG. 1B is a plan view showing a pattern of the arrangement;

FIGS. 2A and 2B show an arrangement according to a second embodiment of the present invention, in which FIG. 2A is a sectional view of the arrangement, and FIG. 2B is a plan view showing a pattern of the arrangement;

FIGS. 3A and 3B show an arrangement according to a third embodiment of the present invention, in which FIG. 3A is a sectional view of the arrangement, and FIG. 3B is a plan view showing a pattern of the arrangement.

DETAILED DESCRIPTION OF THE PREFERRED EMBODIMENTS

Preferred embodiments of the present invention will be described below with reference to the accompanying drawings.

Figure 1A:
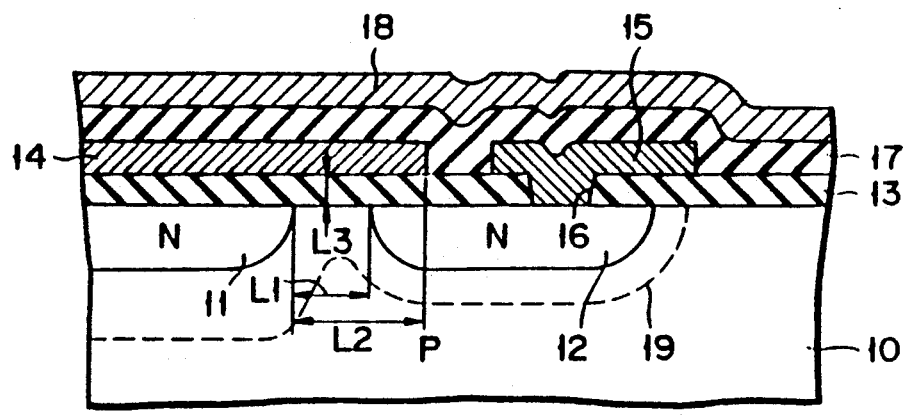
Figure 1B:
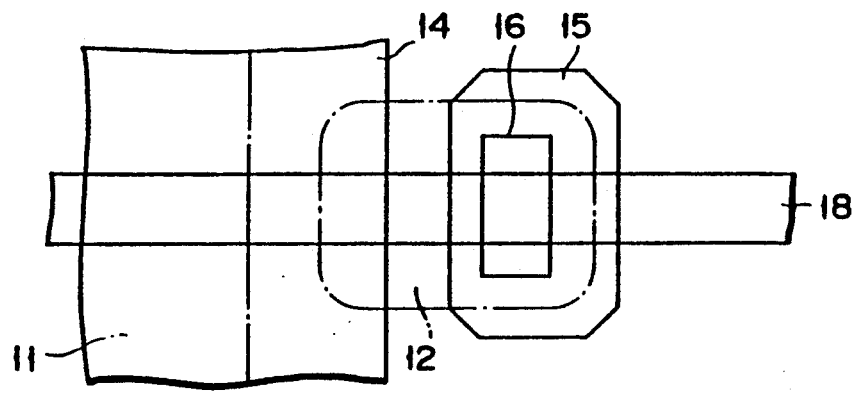

FIGS. 1A and 1B show an arrangement according to a first embodiment of the present invention, in which FIG. 1A is a sectional view and FIG. 1B is a plan view showing a pattern of the arrangement.

Referring to FIGS. 1A and 1B, n-type diffusion regions 11 and 12 are separately formed in p-type silicon semiconductor substrate 10. Silicon oxide (SiO$_2$) insulating layer 13, having a predetermined thickness, is formed on a surface of substrate 10, including the surfaces of diffusion regions 11 and 12.

In addition, polysilicon field plate 14 is formed, via insulating layer 13, over a substrate surface near the end of diffusion region 11. Field plate 14 is formed so as to partially overlap diffusion region 12. Polysilicon field plate 15 is formed through insulating layer 13 on a substrate surface near the end of diffusion region 12. Field plate 15 is connected to a surface of diffusion region 12 formed thereunder, through opening 16 formed in insulating layer 13. Silicon oxide insulating layer 17 is formed on field plates 14 and 15. Wiring layer 18 consisting of aluminum or the like is formed on insulating layer 17.

Note that opening 16 for connecting field plate 15 to diffusion region 12 is formed below wiring layer 18, as is shown by a plan view of the pattern in FIG. 1B.

Assume that substrate 10 is set at a reference potential (0 V), that diffusion region 11 is set at a high potential of about +100 V, and that wiring layer 18 is set at 0 V, respectively. Also assume that field plate 14 is electrically connected to diffusion region 11 in a region which is not shown, and the potential of field plate 14 is set at substantially the same potential as that of diffusion region 11, i.e., about +100 V. Although not shown, a connection structure between region 11 and plate 14 may be the same as that between region 12 and plate 15.

In the above potential state, a spread state of a depletion layer in substrate 10 is represented by reference numeral 19 in FIG. 1A.

More specifically, field plate 14 is formed so as to partially overlap diffusion region 12 which is spaced apart from diffusion region 11. For this reason, the potential of diffusion region 12 depends on a distance between regions 11 and 12 and is lower than the potential of field plate 14 by a value corresponding to the thickness of insulating layer 13. The potential of diffusion region 12 is, for example, half the potential of field plate 14, i.e., about +50 V. The potential is substantially constant throughout diffusion region 12. Therefore, the potential of field plate 15 connected to diffusion region 12 is about +50 V. When wiring layer 18 is set at 0 V, the electric field intensity between the end of field plate 15 and wiring layer 18 is reduced to half that in the device not having field plate 15 and diffusion region 12. For this reason, the withstanding voltage between diffusion region 12 and substrate 10 is greatly increased.

Assume that, in FIG. 1A, distance L1 between ends of N regions 11 and 12 is 15 $\mu$m, that distance L2 between ends of N region 11 and field plate 14 is 20 $\mu$m, that thickness L3 of insulating layer 13 is 1 $\mu$m, and that a concentration of a p-type impurity such as boron is $5 \times 10^{14}$ cm$^{-3}$. Under these conditions, when wiring layer 18 is not formed, a breakdown voltage of the p-n junction between N region 11 and P substrate 10 is about 400 V at room temperature.

When wiring layer 18 having a potential of 0 V is formed without N region 12 under the same conditions as described above, however, the breakdown voltage of the p-n junction between N region 11 and P substrate 10 is reduced to about 200 V to 250 V. As is shown in FIG. 1A, when region 12 according to the present invention is formed, the breakdown voltage of the p-n junction between N region 11 and P substrate 10 can be increased to about 300 V to 350 V, in spite of the presence of wiring layer 18 having a potential of 0 V.

As has been described above, in the first embodiment, the withstanding voltage characteristics can be improved without increasing the thickness of interlayer insulating layer 13. As a result, disadvantages of the conventional device caused upon increasing the thickness of the interlayer insulating layer, such as variations in withstanding voltage characteristics or degradation of reliability, are completely eliminated.

In addition, when the withstanding voltage can be increased, if the withstanding voltage characteristics remain substantially the same as those of the conventional device, a higher potential than the potential of the conventional device can be applied to diffusion region 11. Therefore, the device according to the present invention is effectively used for various applications.

Figure 2A:
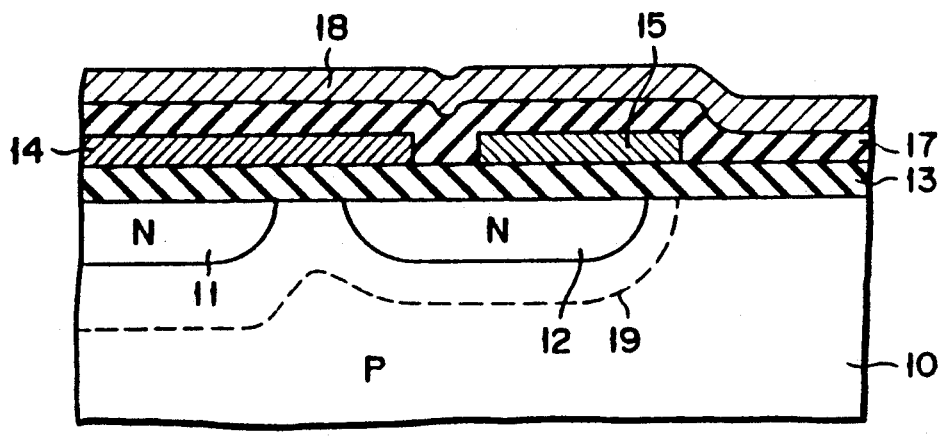
Figure 2B:
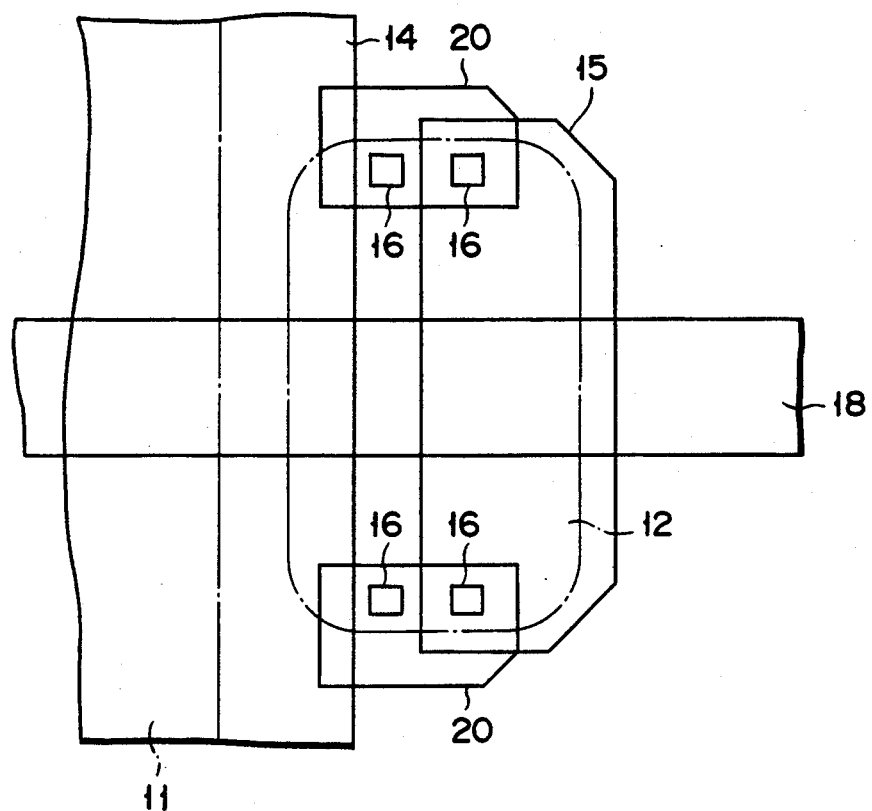

FIGS. 2A and 2B show an arrangement according to a second embodiment of the present invention, in which FIG. 2A is a sectional view, and FIG. 2B is a plan view showing a pattern of the arrangement. A difference between the devices of the first and second embodiments is as follows. In the second embodiment, a plurality of openings 16 for connecting field plate 15 and diffusion region 12 are formed in the region except for portions under wiring layer 18, as shown in the plan view in FIG. 2B. Each aluminum wiring layer 20 is formed at a pair of corresponding openings 16. Diffusion region 12 is connected to field plate 15 through wiring layers 20.

In the structure shown in FIGS. 1A and 1B, a step of forming opening 16 in insulating layer 13 is required besides the opening forming step of connecting aluminum wiring layer 18 to a prescribed circuit element on substrate 10. On the contrary, in FIGS. 2A and 2B, N layer 12 can be electrically connected to field plate 15 in the step of forming openings 16 in aluminum layers 20. This step can be simultaneously performed together with the step of forming an opening in aluminum wiring layer 18. Therefore, the embodiment in FIGS. 2A and 2B is more advantageous than the embodiment in FIGS. 1A and 1B because the number of device manufacturing steps is reduced.

On the other hand, aluminum wiring layer 18 overlaps opening 16, in the structure shown in FIGS. 1A and 1B. In the structure in FIG. 2, openings 16 are separately formed next to aluminum wiring layer 18. Therefore, the structure in FIGS. 1A and 1B is more advantageous than the structure in FIG. 2 because a packing density of the device is increased.

Figure 3A:
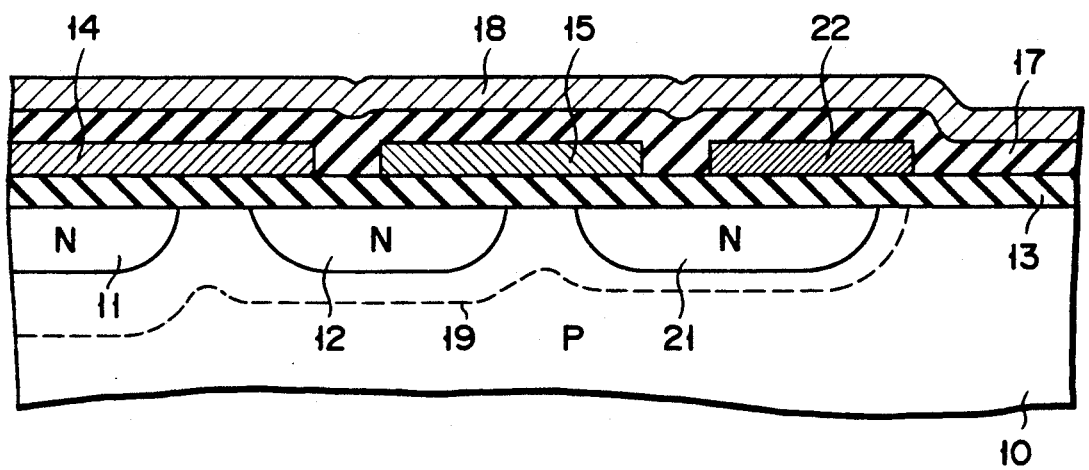
Figure 3B:
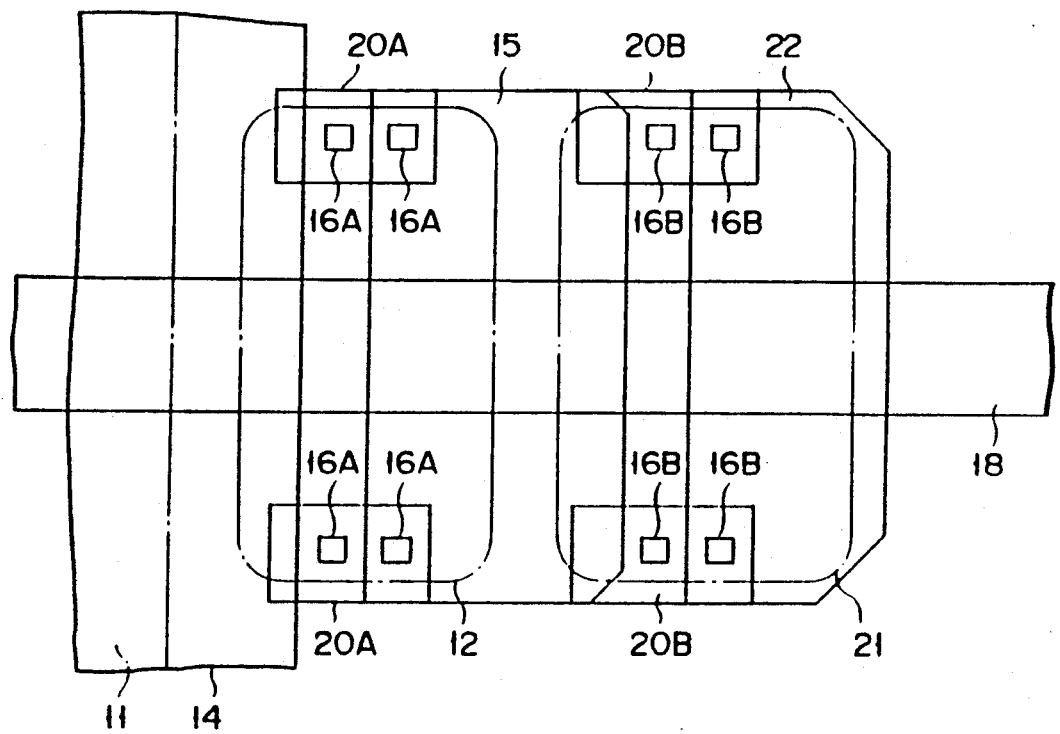
Figure 4:
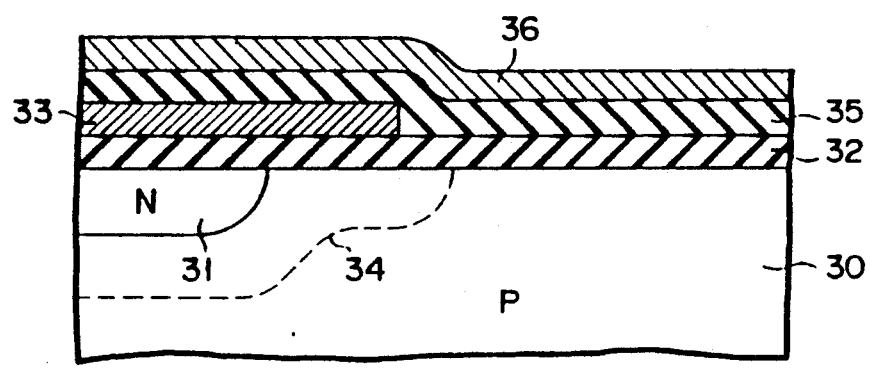
FIG. 4 is a sectional view of conventional device having the problems to be solved by the present invention.

FIGS. 3A and 3B show an arrangement according to a third embodiment of the present invention, in which FIG. 3A is a sectional view, and FIG. 3B is a plan view showing a pattern of the arrangement. In the device of the third embodiment, diffusion region 12, serving as a diffusion region other than diffusion region 11 to which a high voltage is directly applied, is formed in the same manner as the above devices according to the first and second embodiments. At the same time, n-type diffusion region 21 spaced apart from above diffusion regions 11 and 12 is formed. Field plate 15 is formed so as to partially overlap diffusion region 21. Polysilicon field plate 22 is formed through insulating layer 13 on a surface near the end of diffusion region 21.

Field plate 15 is connected to diffusion region 12 through openings 16A formed in the region except for the region under wiring layer 18, via aluminum wiring layers 20A, in the same manner as in FIGS. 2A and 2B. Field plate 22 is connected to diffusion region 21 through openings 16B formed in the region except for the region under wiring layer 18, via aluminum wiring layers 20B, in the same manner as field plate 15 described above.

In the device according to the third embodiment, field plate 15 is formed so as to partially overlap diffusion region 21 which is spaced apart from diffusion region 12. For this reason, the potential of diffusion region 21 is lower, by a value corresponding to the thickness of insulating layer 13, than the potential of diffusion region 12 whose potential is further reduced from the potential of diffusion region 11. The potential of diffusion region 21 is, for example, half the potential of field plate 15, i.e., about +25 V. Therefore, the potential of field plate 22 connected to diffusion region 21 is reduced to about +25 V. An electric field intensity between the end of field plate 22 and wiring layer 18 is further reduced below that in FIGS. 1 and 2. For this reason, the withstanding voltage characteristics between substrate 10 and diffusion region 21 are further improved.

It is a matter of course that the present invention is not limited to the above embodiments, and various modifications can be effected. In the above embodiments, for example, diffusion region 12 or two series diffusion regions 12 and 21 are formed as the regions other than diffusion region 11. However, the number of diffusion regions arranged in series through the field plate can be desirably increased to three or more, thereby further improving the withstanding voltage characteristics.

In addition, in the above embodiments, the n-type diffusion region is formed in the p-type substrate, however, p-type well region 10 can be similarly formed in the n-type substrate.

In addition, structures (12, 15, etc.) for improving withstanding voltage characteristics according to the present invention can be applied to not only an Si semiconductor but also a GaAs semiconductor.

Materials for field plates 14, 15, and 22 are not limited to polysilicon. A refractory metal such as Mo or Ti, or a silicide of a refractory metal such as W, Mo, or Ti can be used for the field plate.

As has been described above, according to the present invention, there is provided a semiconductor device which can increase its withstanding voltage without variations in withstanding voltage characteristics and degradation of reliability of the device.

What is claimed is:

1. A semiconductor device comprising:
   a semiconductor substrate region of a first conductivity type;
   a first semiconductor region of a second conductivity type formed in said semiconductor substrate region and exposed on a surface of said substrate region;
   a second semiconductor region of the second conductivity type formed in said semiconductor substrate region, exposed on the surface of said semiconductor substrate region, spaced apart from said first semiconductor region to be adjacent thereto, and having an insular configuration;
   a first insulating layer formed on the surface of said semiconductor substrate region;
   a first field plate, having a conductive property, and formed via said first insulating layer over said first semiconductor region, and over a portion defined by a distance between adjacent ends of said first and second semiconductor regions, said first field plate receiving a potential which is substantially the same as a potential of said first semiconductor region;
   a second field plate, having a conductive property, and formed via said first insulating layer over said second semiconductor region, excluding the portion defined by said distance between the ends of said first and second semiconductor regions;
   connector means for applying substantially the same potential as the potential of said second semiconductor region to said second field plate;
   a second insulating layer for covering said first and second field plate; and
   a conductive wiring layer formed on said second insulating layer over said first and second field plates, said conductive wiring layer receiving a potential which is different from the potentials of said first and second field plates;
   wherein said distance between the ends of said first and second semiconductor regions is greater than a thickness of said first insulating layer over an area between adjacent ends of said first and second semiconductor regions an less than a distance between the end of said first semiconductor region and an edge of said first field plate, which edge is located over said second semiconductor region; and
   wherein a width of said second semiconductor region is greater than a width of said conductive wiring layer, but is smaller than the width of said first and second field plates.

2. A device according to claim 1, wherein said connector means includes:
   an opening formed in part of said first insulating layer on said second semiconductor region; and
   a conductive portion in contact with said second semiconductor region through said opening and continuous to said second field plate.

3. A device according to claim 1, wherein said connector means includes:
   an opening formed in part of said first insulating layer immediately under said wiring layer over said second semiconductor region; and
   a conductive portion in contact with said second semiconductor region through said opening and continuous to said second field plate.

4. A device according to claim 1, wherein said connector means includes:
   an opening formed in part of said first insulating layer on said second semiconductor region, excluding a part immediately under said wiring layer; and
   a conductive portion in contact with said second semiconductor region through said opening and continuous to said second field plate.

5. A device according to claim 1, wherein said first and second field plates include polysilicon.

6. A device according to claim 1, wherein said first and second field plates include Mo or Ti.

7. A device according to claim 1, wherein said first and second field plates include a silicide of W, Mo, or Ti.

8. A device according to claim 1, further including:
   a third semiconductor region of the second conductivity type formed in said semiconductor substrate region, exposed on the surface of said semiconductor substrate region, and spaced apart from said first and second semiconductor regions to be adjacent to said second semiconductor region;
   a third field plate, having a conductive property, and formed via said first insulating layer over said third semiconductor region, excluding a portion formed between the ends of said second and third semiconductor regions;
   second connecting means for applying substantially the same potential as the potential of said third semiconductor region to said third field plate,
   wherein said second field plate is formed through said first insulating layer on said second semiconductor region, including the portion between the ends of said second and third semiconductor regions.

9. A semiconductor device comprising:
a first semiconductor region of a first semiconductivity type;
a second semiconductor region of a second semiconductivity type formed in said first semiconductor region;
a first insulating layer formed on a surface of said first semiconductor region, including a surface of said second semiconductor region;
a first conductive layer formed via said first insulating layer over the surface of said second semiconductor region, and having substantially the same potential as that of said second semiconductor region;
a third semiconductor region of the second semiconductivity type formed in said first semiconductor region and spaced apart from said second semiconductor region and overlapping a part of said first conductive layer via said first insulating layer;
a second conductive layer electrically connected to said third semiconductor region through an opening formed in said first insulating layer; and
a third conductive layer formed via a second insulating layer over surfaces of said first and second conductive layers;
wherein said distance between the adjacent ends of said second and third semiconductor regions is greater than a thickness of said first insulating layer over an area between adjacent ends of said second and third semiconductor regions and is less than a distance between the end of said second semiconductor region and an edge of said first conductive layer, which edge is located over said third semiconductor region; and
wherein a width of said second semiconductor region is greater than a width of said third conductive layer.

10. A device according to claim 9, wherein said opening is formed under said third conductive layer.

11. A device according to claim 9, wherein said opening is formed under a portion of said second conductive layer other than a portion under said first conductive layer.

12. A device according to claim 1, wherein an impurity concentration of said semiconductor substrate region is on the order of $5 \times 10^{14}$ cm$^{-3}$.

13. A device according to claim 9, wherein an impurity concentration of said first semiconductor substrate region is on the order of $5 \times 10^{14}$ cm$^{-3}$.

14. A semiconductor device comprising:

a semiconductor substrate of a first conductivity type;
a first semiconductor region of a second conductivity type formed in the semiconductor substrate and exposed on a surface of the semiconductor substrate;
a second semiconductor region of the second conductivity type formed in the semiconductor substrate, exposed on the surface of the semiconductor substrate, and spaced apart from the first semiconductor region to be adjacent thereto;
a first insulating layer formed on the surface of the semiconductor substrate;
a first field plate, having a conductive property, and formed via said first insulating layer over the first semiconductor region, and over a portion defined by a distance between adjacent ends of said first and second semiconductor regions, the first field plate receiving a potential which is substantially the same as a potential of the first semiconductor region;
a second field plate, having a conductive property, and formed via the first insulating layer over the second semiconductor region, excluding the portion defined by the distance between the ends of said first and second semiconductor regions;
a second insulating layer for covering the first and second field plates;
a conductive wiring layer formed on the second insulating layer over the first and second field plates, the conductive wiring layer receiving a potential which is different from the potentials of the first and second field plates; and
at least one wiring layer formed on the second insulating layer adjacent to and concurrently with the conductive wiring layer;
wherein a plurality of openings are formed in the at least one wiring layer to connect the second field plate and the second semiconductor region;
wherein the distance between the ends of the first and second semiconductor regions is greater than a thickness of the first insulating layer over an area between adjacent ends of the first and second semiconductor regions and less than a distance between the end of said first semiconductor region and an edge of the first field plate, which edge is located over the second semiconductor region; and
wherein a width of the second semiconductor region is greater than a width of the conductive wiring layer, but is smaller than the width of said first and second field plates.

* * * * *

UNITED STATES PATENT AND TRADEMARK OFFICE
CERTIFICATE OF CORRECTION

PATENT NO. : 5,075,754
DATED : December 24, 1991
INVENTOR(S) : Koji SHIRAI et al.

It is certified that error appears in the above-identified patent and that said Letters Patent is hereby corrected as shown below:

Claim 1, column 6, line 2, change "plate" to --plates--.

Claim 14, column 8, line 16, change "said" to --the--.

Claim 14, column 8, line 44, change "said" to --the--.

Signed and Sealed this

Fifteenth Day of June, 1993

Attest:

MICHAEL K. KIRK

*Attesting Officer*   *Acting Commissioner of Patents and Trademarks*